(12) United States Patent
Kojima et al.

(10) Patent No.: US 6,216,333 B1
(45) Date of Patent: *Apr. 17, 2001

(54) OXIDE SUPERCONDUCTOR CURRENT LEAD AND METHOD OF MANUFACTURING THE SAME

(75) Inventors: Masahiro Kojima; Shuetsu Haseyama; Shuji Yoshizawa; Mamoru Sato, all of Tokyo (JP)

(73) Assignee: Dowa Mining Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/927,462

(22) Filed: Sep. 11, 1997

(30) Foreign Application Priority Data

Feb. 28, 1997 (JP) .................................................. 9-046184

(51) Int. Cl.[7] .................................................. H01L 39/24
(52) U.S. Cl. .................... 29/599; 174/125.1; 505/121; 505/126; 505/700; 505/782
(58) Field of Search ................................ 174/15.4, 15.5, 174/125.1; 505/121, 126, 700, 782, 875, 885, 887

(56) References Cited

U.S. PATENT DOCUMENTS 5,610,123 * 3/1997 Sato et al. .................... 505/782 X
5,623,240 * 4/1997 Sakurabe et al. ............... 174/15.4 X

FOREIGN PATENT DOCUMENTS 1-188456   7/1989   (JP) .
1-242421   9/1989   (JP) .

(List continued on next page.)

OTHER PUBLICATIONS

Kikuchi et al. "Influence of Cooling Rate on Superconducting Characteristics of Bi–Pb–Sr–Ca–Cu–O Ceramics", Japanese Journal of Applied Physics, vol. 28, No. 3, Mar., 1989, pp. L 371–L372.

(List continued on next page.)

Primary Examiner—Carl J. Arbes
(74) Attorney, Agent, or Firm—Oliff & Berridge, PLC

(57) ABSTRACT

An oxide superconductor current lead provided with a rod-like or pipe-like oxide superconductor, at each of end parts of which a metallic electrode is formed. In this oxide superconductor current lead, the oxide superconductor is a $Bi_2Sr_2Ca_2Cu_3O_X$ superconductor. Further, the metallic-electrode-portion contact resistivity thereof is not more than 0.05 $\mu\Omega \cdot cm^2$. Moreover, the critical current density is not less than 2,000 $A/cm^2$. Furthermore, there is provided a method of manufacturing such an oxide superconductor current lead. To perform this method, optimum conditions for conducting a heat treatment when forming electrodes at both ends of an oxide superconductor current lead are detected. Thereby, the contact resistivity during a superconducting coil becomes extremely small. Further, the critical current density is considerably enhanced. In the case of this method, an oxide superconductor (8) obtained by finishing a final sintering process is first worked into or shaped like a rod or a pipe. Then, metallic electrode portions (9) are formed by winding metallic foil around end parts of the superconductor, or by applying metallic paste thereto, or by performing a physical vapor phase epitaxy process such as a sputtering process or an evaporation process. Subsequently, a heat treatment is performed on the metallic electrode portions at a temperature, which is in a 810 to 830° C. range, for a time period of 2 to 20 hours. Thus, an oxide superconductor current lead is obtained.

7 Claims, 16 Drawing Sheets

FOREIGN PATENT DOCUMENTS

| | | |
|---|---|---|
| 1-261230 | 10/1989 | (JP) . |
| 1-278449 | 11/1989 | (JP) . |
| 2-289427 | 11/1990 | (JP) . |
| 7-206443 | 8/1995 | (JP) . |

OTHER PUBLICATIONS

Ito et al., "Influence of Intermediate Pressing on Superconducting Characteristics in Bi–Pb–Sr–Ca–Cu–O System", Japanese Journal of Applied Physics, vol. 28, No. 3, Mar., 1989, pp. L380–L381.

Oota et al., "Single (2223) Phase and Transport current Path in Bi–Pb–Sr–Ca–Cu–O", Japanese Journal of Applied Physics, vol. 29, No. 2, Feb., 1990, pp. L262–L265.

Narumi et al., "Synthesis of 110 K Bi(Pb)–Sr–Ca–Cu–O Oxide Superconductors", Japanese Journal of Applied Physics, vol. 28, No. 1, Jan., 1989, pp. L27–L30.

* cited by examiner

SAMPLE FOR MEASUREMENT OF
ELECTRODE-PORTION CONTACT RESISTIVITY

SAMPLE FOR MEASUREMENT OF
CRITICAL CURRENT DENSITY

F I G. 12

DEPOSITS IN GRAIN BOUNDARIES

DEPOSITS IN GRAIN BOUNDARIES

OXIDE SUPERCONDUCTOR CURRENT LEAD AND METHOD OF MANUFACTURING THE SAME

BACKGROUND OF THE INVENTION

1. Field of the Invention

The present invention generally relates to an oxide superconductor current lead and to a method of manufacturing such an oxide superconductor current lead. More particularly, the present invention relates to an oxide superconductor current lead to be used when supplying a large current (flow) to a superconducting coil cooled by liquid helium, and to a suitable method for manufacturing such an oxide superconductor current lead.

2. Description of the Related Art

Generally, a current lead is used as means for supplying a large current to a superconducting coil placed in liquid helium. Further, current leads made of metallic copper are the mainstream of conventional current leads.

As shown in FIG. 3, it is quite common that in conventional superconducting equipment, first, a superconducting coil 2 is contained in an adiabatic vessel so as to cause a superconducting transition of the superconducting coil 2, and then, liquid helium 4 is injected thereinto, thereby causing the superconducting transition.

No matter how excellent the adiabatic vessel is, the liquid helium 4, which is very expensive, evaporates owing to penetrating heat conducted and radiated from the outside and to penetrating heat transferred from a current lead. Consequently, an amount of evaporated liquid helium, thus, the running cost of the superconducting equipment depends largely upon the quality of the current lead 3. This is very serious problem in putting this equipment to practical use.

Further, the following two kinds of heat are considered as such penetrating heat coming from a current lead:

(A) Penetrating heat produced due to the thermal conduction from the outside of the equipment.

(B) Joule heat generated from a current lead by actually energizing a superconducting coil with a large current.

Although Joule heat herein-above described as of the kind (B) can be reduced by increasing the area of a (transverse) section of the current lead and decreasing the length thereof, the penetrating heat is increased in such a case by an amount of heat transferred owing to the thermal conduction herein-above described as of the kind (A).

Thus, the conventional superconducting equipment is designed so that the sum of amounts of heat of the aforementioned kinds (A) and (B) is minimized. However, it is inevitable that a certain amount of (penetrating) heat penetrates into the adiabatic vessel of the superconducting equipment. Consequently, the conventional superconducting equipment has not come to change a situation in which most of penetrating heat is originated from a current lead itself.

To overcome such a situation, there has been provided a current lead that uses an oxide high-temperature superconductor. Generally, the critical temperature of a high-temperature oxide superconductor is very high, so that the superconducting transition thereof can be easily achieved even in the case of using inexpensive liquid nitrogen (at 77 K). When an oxide high-temperature superconductor is used in liquid nitrogen as a material of a current lead, heat of the aforementioned kind (B), namely, Joule heat is not generated because the current lead is in a superconducting state. Further, the thermal conductivity of the oxide high-temperature superconductor is very low as compared with metallic copper, because of the fact that this oxide high-temperature superconductor is made of ceramics. Thus, an amount of penetrating heat of the kind (A) can be considerably reduced. Consequently, a total amount of penetrating heat can be largely decreased in comparison with a metallic-copper current lead.

However, the connection between such a current lead and the superconducting coil is thus established between dissimilar materials, namely, metal and ceramics. Therefore, when the current lead is connected with the superconducting coil immersed in liquid helium, large contact resistance occurs. As a result, Joule heat is generated in the connecting portion therebetween. Consequently, an amount of evaporated liquid helium increases.

To prevent such a problem from coming up, electrode portions are first made by plating both end parts of each rod-like (or stick-like) current lead with silver foil or by covering such end parts thereof with silver paste. Then, the plated or covered end parts thereof are baked or burnt so as to form metallic electrode structures. Thereby, the connection between similar materials, namely, between metals is realized. Thus, an attempt has been made to the aforementioned contact resistance. Consequently, the contact resistivity of the electrode portions (hereunder sometimes referred to as "electrode-portion contact resistivity") is reduced to about 1 $\mu\Omega \cdot cm^2$.

As above described, a reduction in the electrode-portion contact resistivity to about 1 $\mu\Omega \cdot cm^2$ has been achieved by forming metallic electrode portions at both end parts of each current lead constituted by an oxide high-temperature superconductor. Even in such a case, when energizing the superconducting coil with an electric current of, for example, 1000 A, a calorific value W is estimated as follows by assuming that the area of a contact surface portion is, for instance, 1 $cm^2$, for brevity of description:

$$W = R \cdot I^2 = (1\ \mu\Omega) \cdot (1000\ A)^2 = 1\ J/s.$$

Thus, the generated Joule heat is still high. If Joule heat generated during energizing the superconducting coil is high, an amount of evaporated coolant such as liquid helium increases. Consequently, the conventional current lead has a problem in lack of economical practicality.

Further, it is confirmed that the critical current density of the oxide superconductor itself composing the current lead changes under the influence of a heat treatment step to be performed for the purpose of forming metallic electrode portions. Thus, there is the possibility of an occurrence of a large reduction in the critical current density according to conditions for the heat treatment. When the critical current density of the oxide superconductor itself lowers on certain conditions, a single current lead cannot be suited to (or adapted for) use in ordinary superconducting equipment that needs to be energized with a large current. Moreover, in the case of using a plurality of current leads connected in parallel with one another, the number of current leads becomes large, so that the equipment has problems in increase in weight and size thereof.

Although studies on a problem of still more reducing the electrode-portion contact resistivity have been conducted, such a problem is not solved yet. Further, attempts have been made to study and design optimum heat treatment conditions by which the critical current density of the oxide superconductor is not reduced. However, such optimum conditions are not detected yet.

The present invention is accomplished to solve the aforementioned problems of the prior art.

SUMMARY OF THE INVENTION

Accordingly, an object of the present invention is to provide an oxide superconductor current lead which can reduce Joule heat generated during energizing a superconducting coil, and which can be adapted for use in ordinary superconducting equipment that needs to be energized with a large current.

Further, another object of the present invention is to provide a method of manufacturing an oxide superconductor current lead, which can even more reduce the electrode-portion contact resistivity of electrode portions by performing a simple step, and which can increase the critical current density of an oxide superconductor itself constituting the current lead.

To achieve the foregoing objects, in accordance with an aspect of the present invention, there is provided an oxide superconductor current lead (hereunder sometimes referred to as a first oxide superconductor current lead of the present invention), which comprises a rod-like (or stick-like) or pipe-like oxide superconductor, at each of end parts of which a metallic electrode is formed. In the first oxide superconductor current lead of the present invention, the aforesaid oxide superconductor is a $Bi_2Sr_2Ca_2Cu_3O_X$ (system) superconductor. Further, the metallic-electrode-portion contact resistivity thereof is not more than 0.05 $\mu\Omega \cdot cm^2$. Moreover, the critical current density is not less than 2,000 $A/cm^2$.

In the case of an embodiment (hereunder sometimes referred to as a second oxide superconductor current lead of the present invention) of the first oxide superconductor current lead of the present invention, a crystalline interface (or a grain boundary) in the aforesaid oxide superconductor of the current lead contains at least one kind of fine particles (or grains) between the following two kinds (1) and (2) of fine particles:

(1) fine particles of $CuO$ or $Cu_2O$, which have particle diameters that are not more than 1.0 $\mu m$; and (2) fine particles of $Ca_2PbO_4$, which have particle diameters that are not more than 1.0 $\mu m$.

In accordance with another aspect of the present invention, there is provided a method (hereunder sometimes referred to as a first method of the present invention) of manufacturing an oxide superconductor current lead. The first method of the present invention comprises: a step of working a $Bi_2Sr_2Ca_2Cu_3O_X$ (system) oxide superconductor, which is obtained by finishing a final step of a process of manufacturing an oxide superconductor, into a rod-like or pipe-like oxide superconductor; a step of forming metallic electrode portions at both end parts of the aforesaid oxide superconductor, respectively; and a step of performing a heat treatment on the aforesaid metallic electrode portions thereof at a temperature in a range of 810 to 830° C. to thereby obtain a current lead.

Further, in accordance with still another aspect of the present invention, there is provided another method (hereunder sometimes referred to as a second method of the present invention) of manufacturing an oxide superconductor current lead. The second method of the present invention comprises: a step of working a $Bi_2Sr_2Ca_2 Cu_3O_{Xs}$ (system) oxide superconductor into a rod-like or pipe-like oxide superconductor just before the final sintering step of an oxide superconductor manufacturing process; a step of forming metallic electrode portions at both end parts of the aforesaid oxide superconductor, respectively; and a step of performing a heat treatment, which is added to the forementioned final sintering step, on the aforesaid metallic electrode portions thereof at a temperature in a 810 to 830° C. range to thereby obtain a current lead.

In the case of an embodiment (hereunder sometimes referred to as a third method of the present invention) of the first or second method of the present invention, the aforesaid step of forming metallic electrode portions at both end parts of the aforesaid rod-like or pipe-like oxide superconductor, respectively, is performed by carrying out one of the following a process of winding metallic foil around the end parts of the aforesaid oxide superconductor, a process of applying metallic paste thereto, and a physical vapor phase epitaxy process such as a sputtering process or an evaporation (or deposition) process.

In the case of an embodiment (hereunder sometimes referred to as a fourth method of the present invention) of the first, second or third method of the present invention, a time period, during which the aforementioned heat treatment is performed on the aforesaid metallic electrode portions, is 2 to 20 hours.

In the case of an embodiment (hereunder sometimes referred to as a fifth method of the present invention) of one of the first to fourth methods of the present invention, the aforesaid metallic electrode portions employ one or more elements of platinum, gold, silver, copper, indium, iridium and aluminum as materials thereof.

In the case of an embodiment (hereunder sometimes referred to as a fifth method of the present invention) of one of the first to fourth methods of the present invention), a non-superconducting phase composed of a material, the principal ingredients of which are Bi, Pb, Sr, Ca, Cu and O, is substantially vanished in a crystalline interface (or a grain boundary) in the aforesaid oxide superconductor, which constitutes the aforesaid current lead, by performing the aforesaid heat treatment thereon.

When the heat treatment conditions for forming the metallic electrode portions are determined as above described, the contact resistance of the electrode portions of the current lead of the present invention are extremely small, in comparison with that of the electrode portions of the conventional current lead. Moreover, the critical current density of the superconductor itself is considerably improved, as compared with that thereof before the heat treatment is performed. In the case of forming the electrode portions according to the aforementioned heat treatment conditions, the critical current density of the superconductor itself is enhanced in comparison with that thereof before the heat treatment. It is conjectured that the cause or reason of the enhancement of the critical current density would be the improvement of electrical coupling conditions in the crystalline interface (namely, the grain boundary) in which crystal grains come into contact with one another.

In the case of the current leads of the present invention, the oxide superconductors thereof are high-temperature oxide superconductors having a high critical temperature, in which a superconducting transition can be easily caused even when using inexpensive liquid helium.

Further, in the case of producing oxide superconductors by performing the sintering method, metallic electrodes are formed in the oxide superconductor immediately before the final sintering process. Moreover, a heat treatment step to be performed on the metallic electrodes can be included in the final sintering process. Thus, the process of making a current lead can be simplified. Furthermore, the current lead may be shaped like either a rod or a pipe. In addition, the rod-like or pipe-like current lead may be shaped either in a roundish form or in a squarish form.

Heat treatment temperature, at which a heat treatment is performed on the metallic electrode portions, are preferably 810 to 830° C. More preferable heat treatment temperature is 820° C. If the temperature is not higher than 810° C., the strength of the (adhesive) bonding between the superconductor and the metallic electrode in the electrode portion is not sufficiently large. Thus, the electrode-portion contact resistivity becomes high. Conversely, if not lower than 830° C., the superconductor reacts with the metallic electrode in a contact surface portion therebetween. As a result, a compound layer is produced. Consequently, the electrode-portion contact resistivity becomes high.

Further, when the heat treatment temperature is in a 810 to 830° C. range, a heat treatment time period during performing a heat treatment on the metallic electrode portions is preferably 2 to 20 hours. Moreover, when the heat treatment temperature is 820° C., the heat treatment time period is more preferably 8 hours. If the heat treatment time period is not longer than 2 hours, sufficient strength of adhesive bonding is not obtained, whereas electrode-portion contact resistivity becomes high. In contrast, if the heat treatment time period is increased to a length that is not shorter than 20 hours, the electrode-portion contact resistivity becomes high.

As above described, in the case of the current lead of the present invention, the electrode-portion contact resistivity is low, in comparison with that of the conventional current lead. Thus, Joule heat generated during energizing the superconducting coil is reduced. As a result, an amount of evaporated coolant, such as liquid helium, for cooling the superconducting coil and so forth is extremely decreased. Consequently, the current lead of the present invention is economical. Moreover, in the case of the current lead of the present invention, the critical current density of the superconductor itself thereof is high, as compared with that of the superconductor of the conventional current lead. Thus, the current lead of the present invention can be adapted for use in ordinary superconducting equipment that needs to be energized with a large current. Therefore, when using a plurality of current leads connected in parallel with one another, the number of current leads provided in the superconducting equipment can be small. Consequently, the present invention can contribute to a reduction in weight of superconducting equipment and to a decrease in size thereof.

Furthermore, in the case of the method of manufacturing a current lead according to the present invention, the contact resistivity, which is lower than that of the conventional current lead, can be obtained by forming the electrodes under the optimum heat treatment conditions. In addition, the critical current density of the oxide superconductor itself can be improved.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 12 is a diagram showing another TEM photograph of a rod-like superconductor sample produced by performing the method of the present invention;

DETAILED DESCRIPTION OF THE PREFERRED EMBODIMENTS

Figure 1:
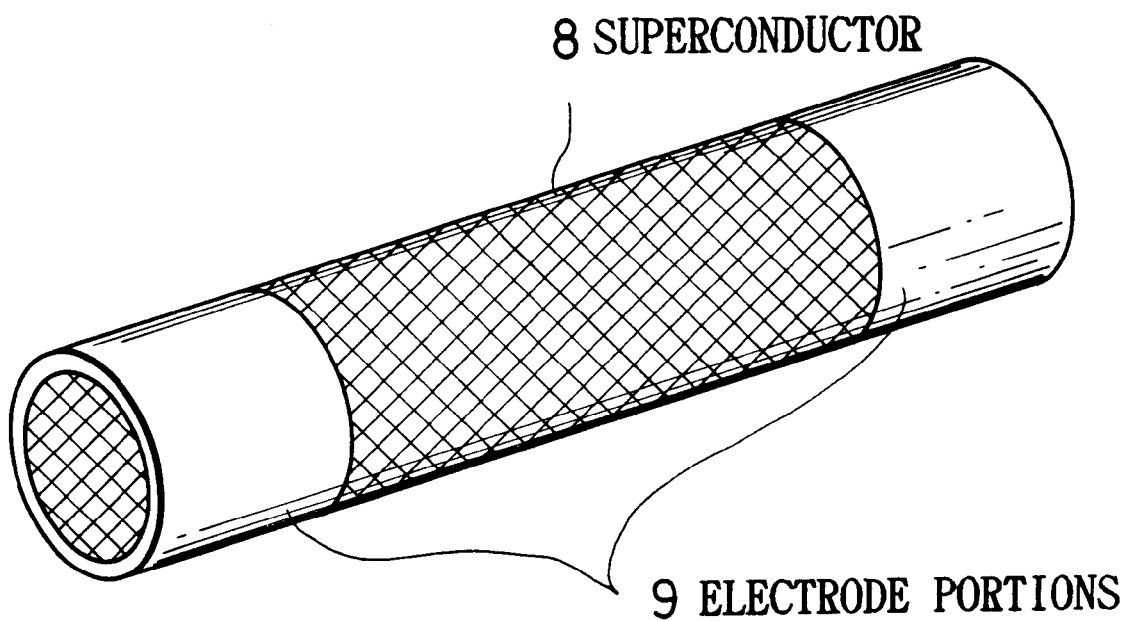
FIG. 1 is a perspective diagram showing a current lead manufactured by a method embodying (namely, an embodiment of) the present invention.

Hereinafter, examples of a method of manufacturing an oxide superconductor current lead according to the present invention, namely, the preferred embodiments of the present invention will be described in detail with reference to the accompanying drawings.

Oxide superconductor to be used in a current lead is, for example, a Bi—Pb—Sr—Ca—Cu—Ox superconductor. Further, in the case of such an oxide superconductor, preferable composition ratios are as follows:

Bi: 1.75 to 1.95

Pb: 0.20 to 0.50

Sr: 1.85 to 2.15

Ca: 1.90 to 2.25

Cu: 2.90 to 3.15

Further, an oxide superconductor having such a composition ratio (generally, referred to as a $Bi_2Sr_2Ca_2Cu_3O_X$ (system) superconductor (incidentally, a superconducting phase is sometimes referred to as a Bi- 2223 phase)) is formed. Thereafter, sintering and compression are repeatedly performed thereon. Upon completion of the final sintering step, the oxide superconductor is worked into a current lead, namely, shaped like a rod or a pipe. The current lead has the following size:

In the case that the current lead is shaped like a round rod, the diameter thereof ranges from 2 to 30 mm; and the length thereof 40 to 300 mm.

Meanwhile, in the case that the current lead is shaped like a pipe, the inside (or internal) diameter ranges from 2 to 96 mm; and the length 40 to 300 mm.

Subsequently, metallic electrode portions are formed at both end parts of the rod-like or pipe-like oxide superconductor, respectively. The metallic electrode portions are made of, for instance, silver and have the following size: namely, the width thereof ranges from 5 to 30 mm; and the film thickness about 20 to 200 $\mu$m. Method of forming the metallic electrode portions at the end parts of the oxide superconductor is to wind metallic foil therearound, or to apply metallic paste thereto, or to perform a physical vapor phase epitaxy process such as a sputtering process or an evaporation process.

Then, a heat treatment is repeatedly performed on these metallic electrode portions at a temperature, which is in a range between 810 and 830° C., for a time period of 2 to 20 hours. Thus, a current lead is obtained. The critical current density Jc of the current lead obtained in this way is about 5,000 to 7,000 A/cm$^2$, and the contact resistivity there of is about 0.05 to 0.005 $\mu\Omega\cdot$cm$^2$. Usually, in the case of commercially available current leads, the critical current density Jc ranges from about 1,000 to 1,500 A/cm$^2$, and the contact resistivity is about 1 $\mu\Omega\cdot$cm$^2$. Therefore, it is found that in the case of the current lead of the present invention, the critical current density and contact resistivity of the current lead are considerably improved.

EXAMPLE 1

In the case of this example, superconductive $Bi_2Sr_2Ca_2Cu_3O_X$ (incidentally, a Bi-2223 phase) synthetic powder of 2.0 g was first charged into a mold (or die), which had a diameter of 20 mm, and was molded by using a uniaxial press applying a total pressure of 10 tons. Then, the sintering of a compact was performed by using an electric furnace at a temperature of 850° C. for a time period of 50 hours. Subsequently, an intermediate compression was conducted by using a coil isostatic press(CIP) apparatus at a pressure of 3 tons/cm$^2$.

Next, the sintering thereof was performed again by using the electric furnace at the temperature of 850° C. for a time period of 50 hours. Thereafter, a second intermediate compression was carried out at a pressure of 3 tons/cm$^2$ by using the CIP apparatus. Finally, the sintering thereof was performed once again by using the electric furnace at a temperature of 850° C. for a time period of 50 hours.

Thereafter, the superconductor obtained in this manner was cut into a squarish rod (having a size of 15 mm×1.5 mm×1.0 mm). Moreover, electrode portions were formed thereon by using silver wires (or lines) and silver paste.

Figure 2A:
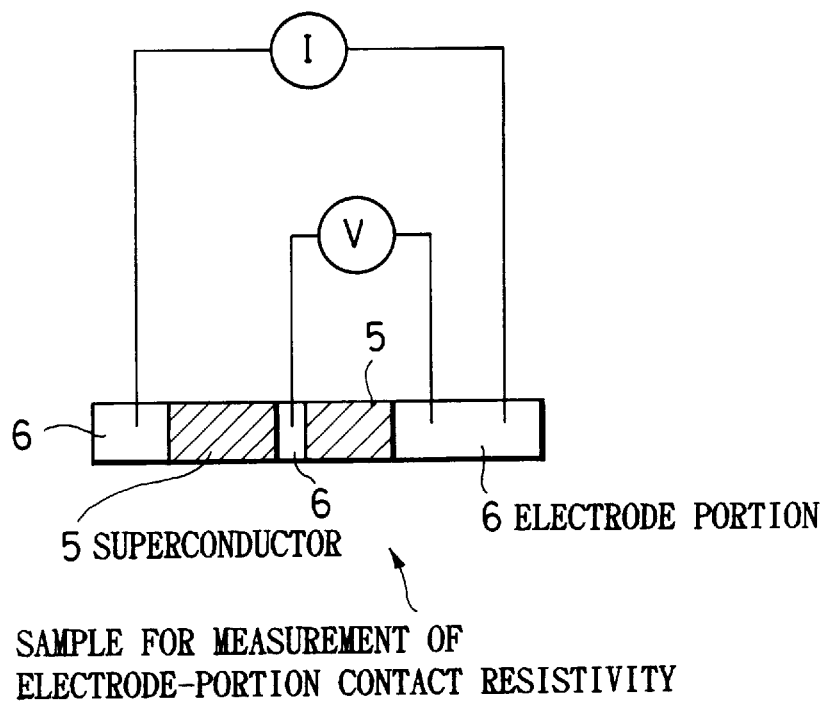
FIG. 2A is a diagram for illustrating a measurement of the electrode-portion contact resistivity of a sample according to the embodiment of the present invention.
Figure 2B:
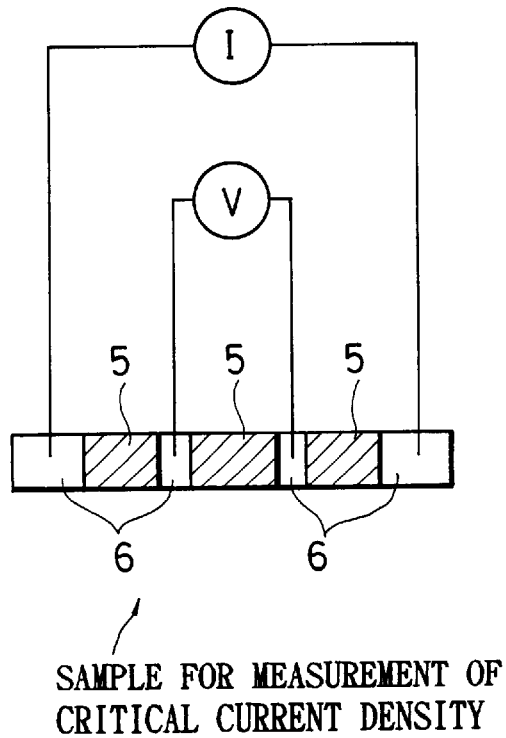
FIG. 2B is a diagram for illustrating a measurement of the critical current density of a sample according to the embodiment of the present invention.
Figure 3:
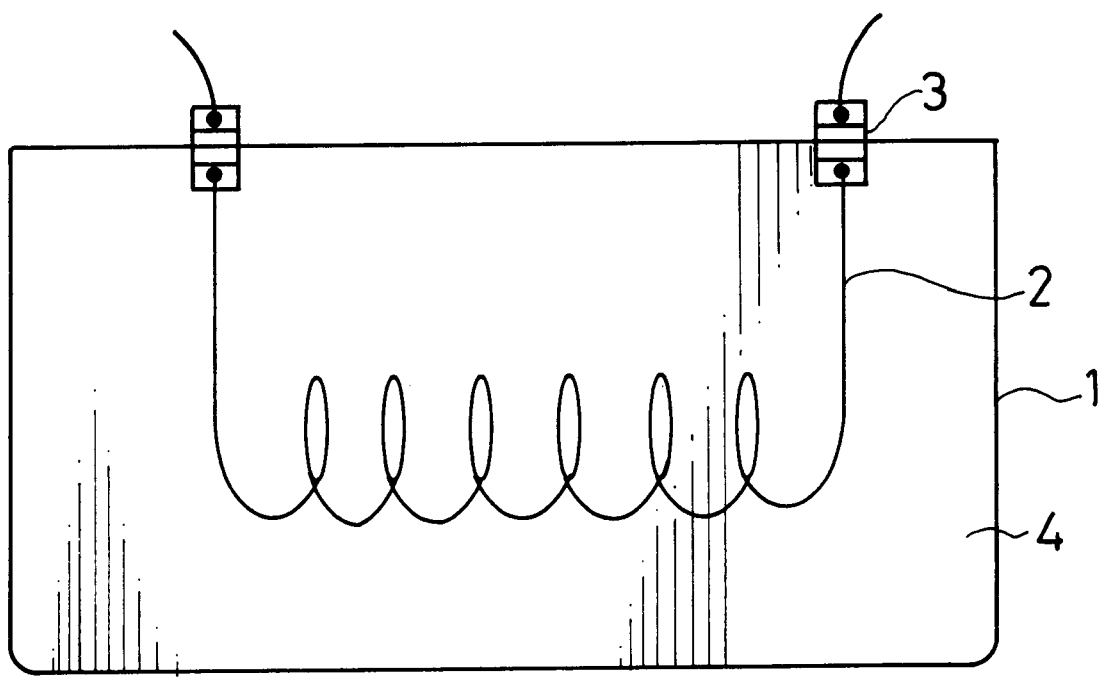
FIG. 3 is a diagram for illustrating superconducting equipment in which an ordinary superconducting coil is cooled by liquid helium.

Further, a sample for measurement of the electrode-portion contact resistivity and a sample for measurement of the critical current density were produced correspondingly to processing conditions according to the relation between the temperature and time (namely, what is called an "experiment matrix") listed in TABLE 1 which will be described below. Then, the electrode-portion contact resistivity of the former sample and the critical current density of the latter sample were effected. Incidentally, the sample for measurement of the electrode-portion contact resistivity was formed so that the electrode-portion contact resistivity was measured by what is called a four terminal method as illustrated in FIG. 2A. Similarly, the sample for measurement of the critical current density was formed so that the critical current density was measured by what is called a four terminal method as illustrated in FIG. 2B. The electrode portions formed on the superconductor 5 were made of silver. Moreover, four terminals 7 were also made of silver. Among these terminals, the outer two terminals were current terminals, and the inner two terminals were voltage terminals.

TABLE 1

| | Heat Treatment Time | | |
|---|---|---|---|
| Heat Treatment Temperature | 2 Hours Electrode-portion Contact Resistivity [$\mu\Omega\cdot$cm$^2$]/ Critical Current Density [A/cm$^2$] | 4 Hours Electrode-portion Contact Resistivity [$\mu\Omega\cdot$cm$^2$]/ Critical Current Density [A/cm$^2$] | 8 Hours Electrode-portion Contact Resistivity [$\mu\Omega\cdot$cm$^2$]/ Critical Current Density ]A/cm$^2$] |
| 840° C. | 0.206/2,080 | 0.491/1,920 | 1.095/1,540 |
| 820° C. | 0.054/3,590 | 0.015/4,250 | 0.012/5,200 |
| 800° C. | 0.105/2,380 | 0.400/3,000 | 0.224/1,930 |
| 780° C. | 12.104/1,310 | 2.271/950 | 20.460/1,140 |
| 760° C. | 69.420/1,460 | 4.712/1,110 | 30.400/990 |

As above stated, in the case of the conventional current lead, the electrode-portion contact resistivity was about 1 $\mu\Omega\cdot$cm$^2$ and the critical current density Jc was about 1,500 A/cm$^2$. Therefore, in the case that the heat treatment temperature was not higher than 780° C., even if the heat treatment time period was changed, the electrode-portion contact resistivity and critical current density were not improved, but was deteriorated instead of being improved. In contrast, if the heat treatment temperature was 800 or 820° C., the electrode-portion contact resistivity and critical current density were improved in the case that the heat treatment time period ranged from 2 to 8 hours. Furthermore, if the heat treatment temperature was 840° C., the electrode-portion contact resistivity and critical current density were improved in the case that the heat treatment time period ranged from 2 to 4 hours.

Especially, in the case that the heat treatment temperature was 820° C., there was a desirable tendency to improve the characteristics of the current lead, namely, a tendency that the electrode-portion contact resistivity decreased with increase in time and moreover, the critical current density rose with increase in time. Furthermore, in the case that the heat treatment time period was 8 hours, the lowest contact resistivity of 0.012 $\mu\Omega\cdot$cm$^2$ was obtained. At that time, the critical current density was about 5,200 A/cm$^2$, and Joule heat generated in the electrode portions became about (1/100) that generated in the electrode portions of the conventional current lead. In addition, the critical current density became equal to or exceeded three times that of the conventional current lead.

Furthermore, it revealed that when performing the heat treatment on the metallic electrode portions formed at the end parts of the oxide superconductor current lead, the electrode-portion contact resistivity was reduced but the critical current density was increased even in the case where the heat treatment temperature was in the range of 810 to 830° C. and the heat treatment time was in the range of 2 to 20 hours.

EXAMPLE 2

In the case of this example, superconductive $Bi_2Sr_2Ca_2Cu_3O_X$ (incidentally, a Bi-2223 phase) synthetic powder was first charged into a molding jig. Then, such powder was molded by using a CIP apparatus at 3 tons/cm². Incidentally, the size of a compact was 7 mmφ×150 mm.

Subsequently, the sintering thereof was performed in the air by using a rectangular electric furnace at the temperature of 850° C. for a time period of 50 hours. Incidentally, the tolerable sintering temperature was 850° C. ±5° C. Thereafter, an intermediate compression was carried out at a pressure of 3 tons/cm² by using the CIP apparatus.

Then, the sintering thereof was performed again in the air by using a rectangular electric furnace at the temperature of 850° C. for a time period of 50 hours. Thereafter, a second intermediate compression was carried out at a pressure of 3 tons/cm² by using the CIP apparatus. Finally, the sintering thereof was performed in the air by using the rectangular electric furnace at the temperature of 850° C. for a time period of 50 hours.

A sample obtained in the aforementioned process was worked by being grounded by means of a turning machine (namely, a lathe) into a round rod-like sample whose size was 4.2 mmφ×145 mm.

Next, silver paste, Butyl-Carbitol-Acetate (BCA) and phosphate were mixed with one another in a weight ratio of 100:15:2. Subsequently, such a mixture was applied to both end parts of the rod-like sample by being sprayed thereon. Then, the sample was put into a dryer or drier and was further dried therein. Thereafter, the mixture was applied again to the sample by being sprayed thereon. Thus, after repeating the application of the mixture thereto three to five times by being sprayed thereon, the sample was put into the drier and was dried for 2 hours.

Then, a current lead was formed by sintering this sample by means of the rectangular electric furnace in the air at a temperature of 820° C. for 8 hours. The tolerable sintering temperature was 820° C.±1° C.

FIG. 1 shows a finally completed current lead. In this figure, reference numeral 8 designates a superconductor; and 9 electrode portions made of silver. As a result of feeding a d.c. current through this current lead at a temperature of 77 K in a zero (magnetic) field, an obtained critical current was 710 A. If converting this critical current to a critical current density, the obtained critical current density is about 5,100 A/cm².

Next, results of analysis performed on a rod-like sample (namely, an oxide superconductor) to be used for each current lead will be described hereinbelow starting with the description of TEM photographs of crystal grains of the sample.

Figure 4:
FIG. 4 is a diagram showing a transmission electron microscope (TEM) photograph of a rod-like superconductor sample produced by performing a conventional method which is other than the method of the present invention.
Figure 5:
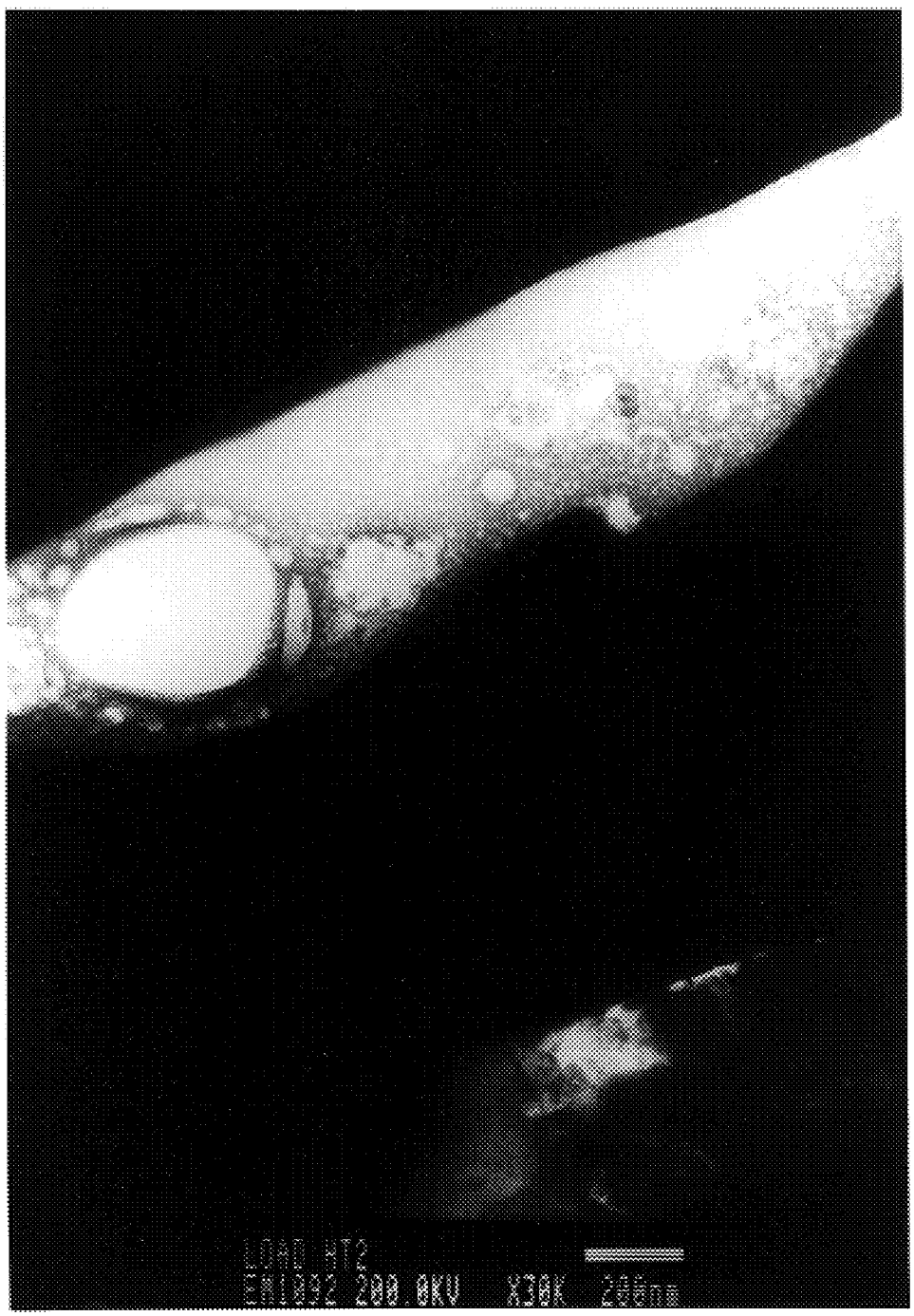
FIG. 5 is a diagram showing another TEM photograph of a rod-like superconductor sample produced by performing a conventional method which is other than the method of the present invention.
Figure 6:
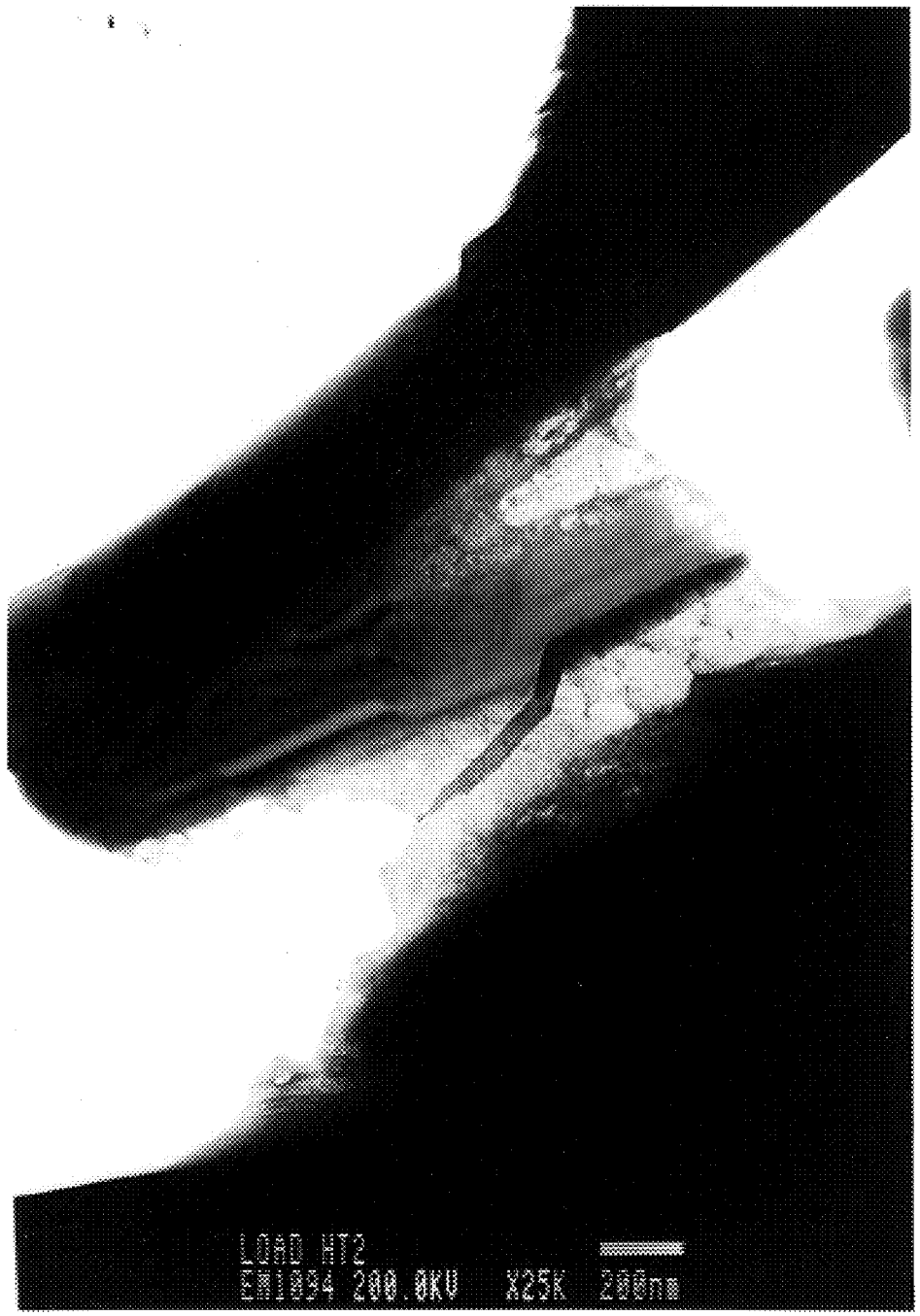
FIG. 6 is a diagram showing still another TEM photograph of a rod-like superconductor sample produced by performing a conventional method which is other than the method of the present invention.
Figure 7:
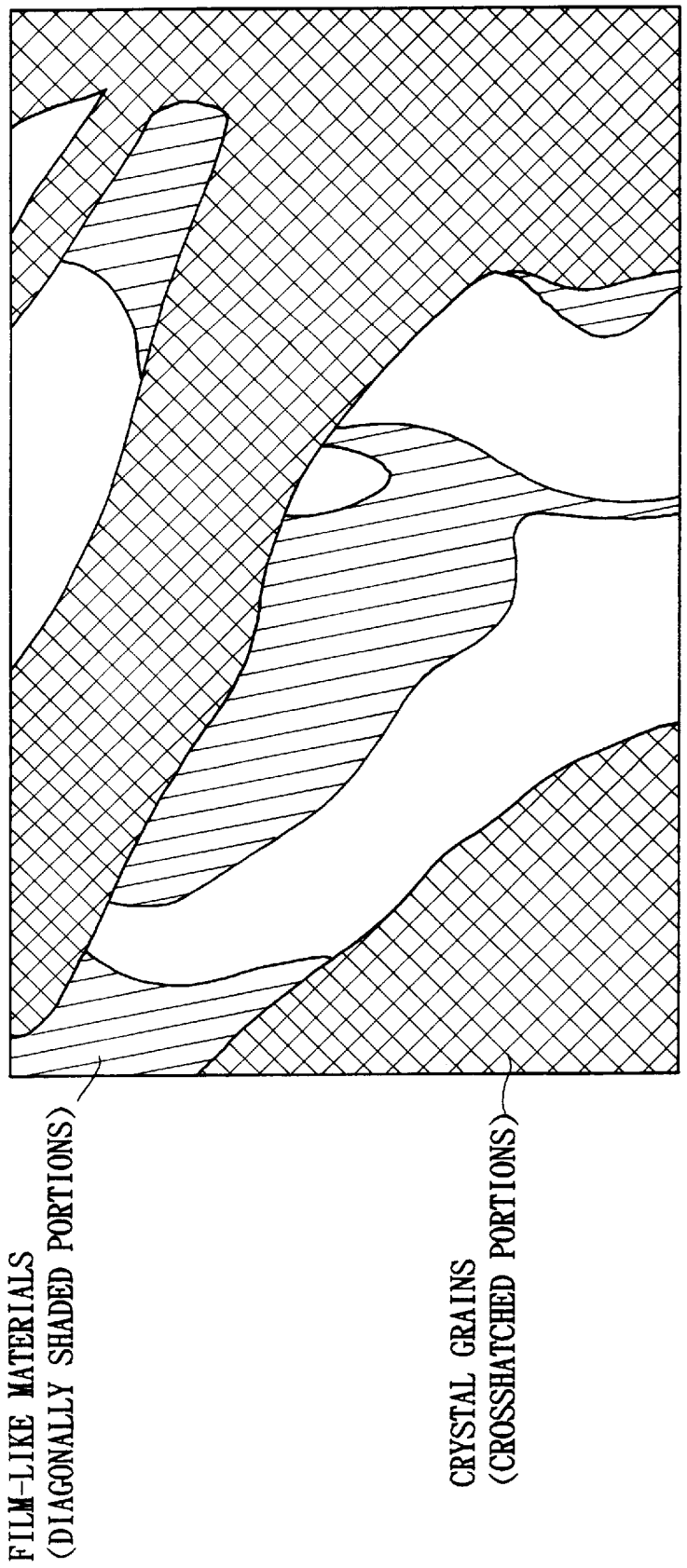
FIG. 7 is a schematic diagram of the photograph of FIG. 4.
Figure 8:
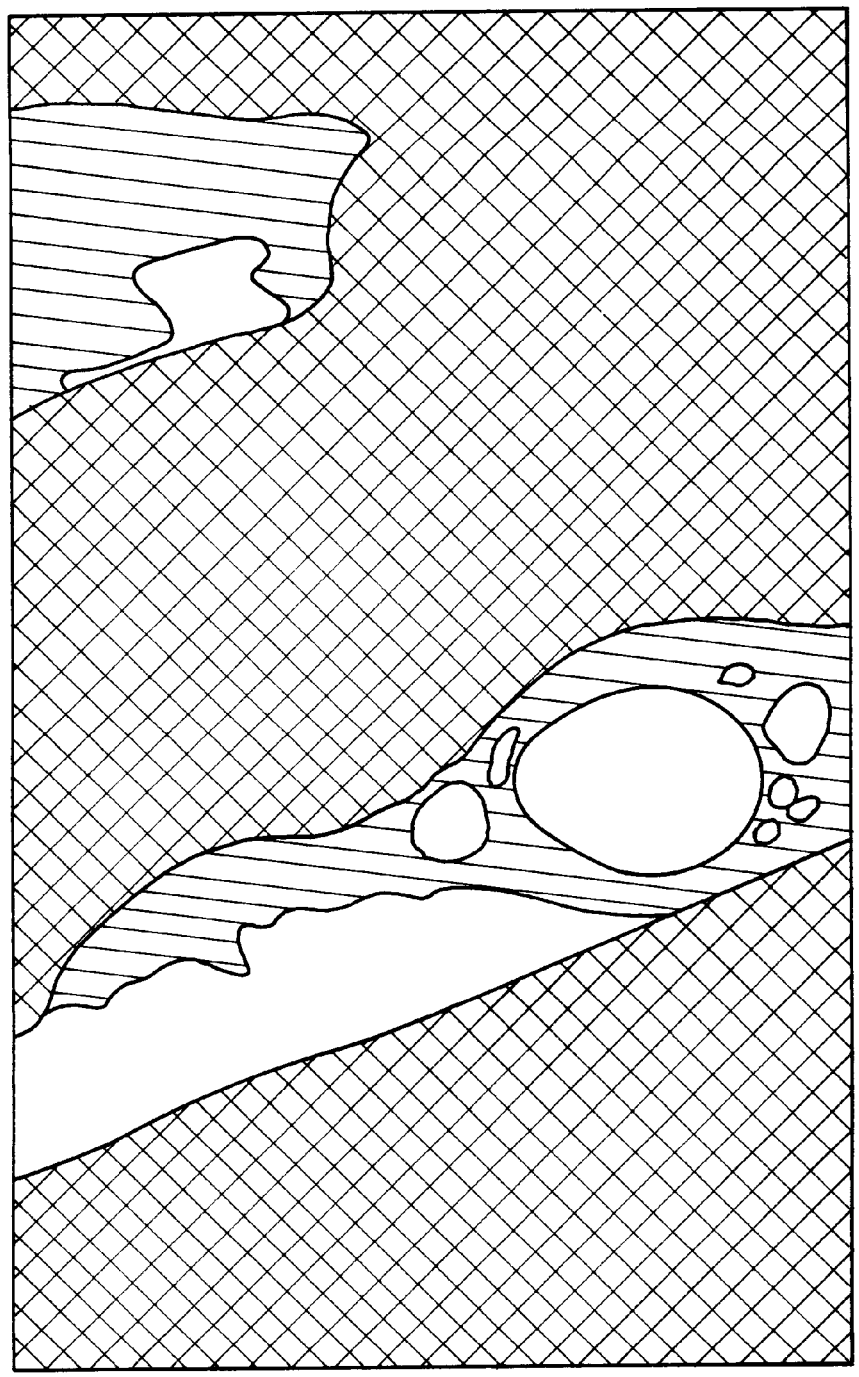
FIG. 8 is a schematic diagram of the photograph of FIG. 5.
Figure 9:
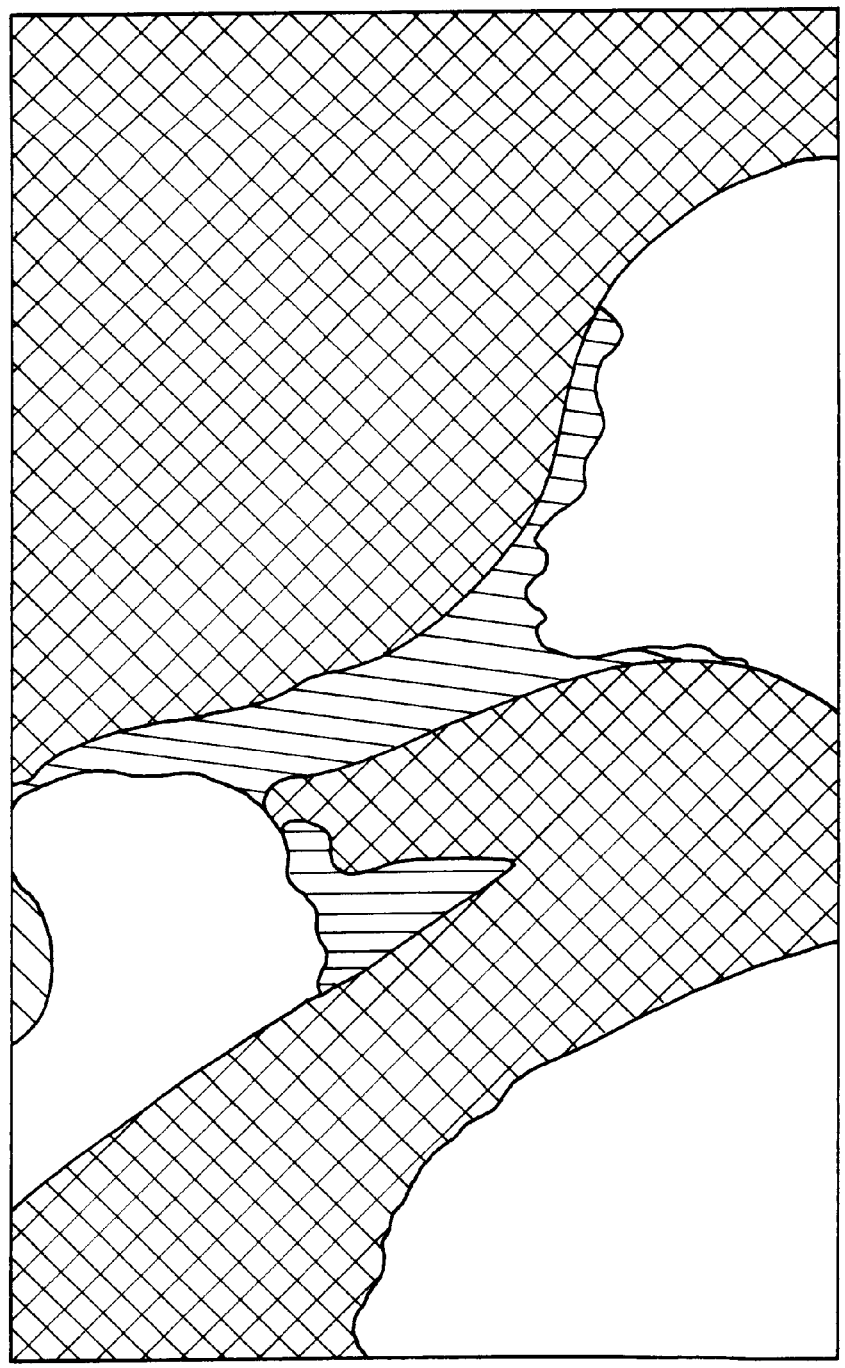
FIG. 9 is a schematic diagram of the photograph of FIG. 6.

FIGS. 4 to 6 show TEM photographs of a sample in the case that the sample was manufactured by a method (hereunder sometimes referred to as a conventional method), which is other than the method of the present invention, namely, by setting the aforementioned sintering temperature at a temperature (in the case of this example, 800° C. (incidentally, the heat treatment time period was set at 2 hours)) outside a range of 810 to 830 ° C. FIGS. 7 to 9 are diagrams schematically illustrating the photographs of FIGS. 4 to 6, respectively.

Figure 10:
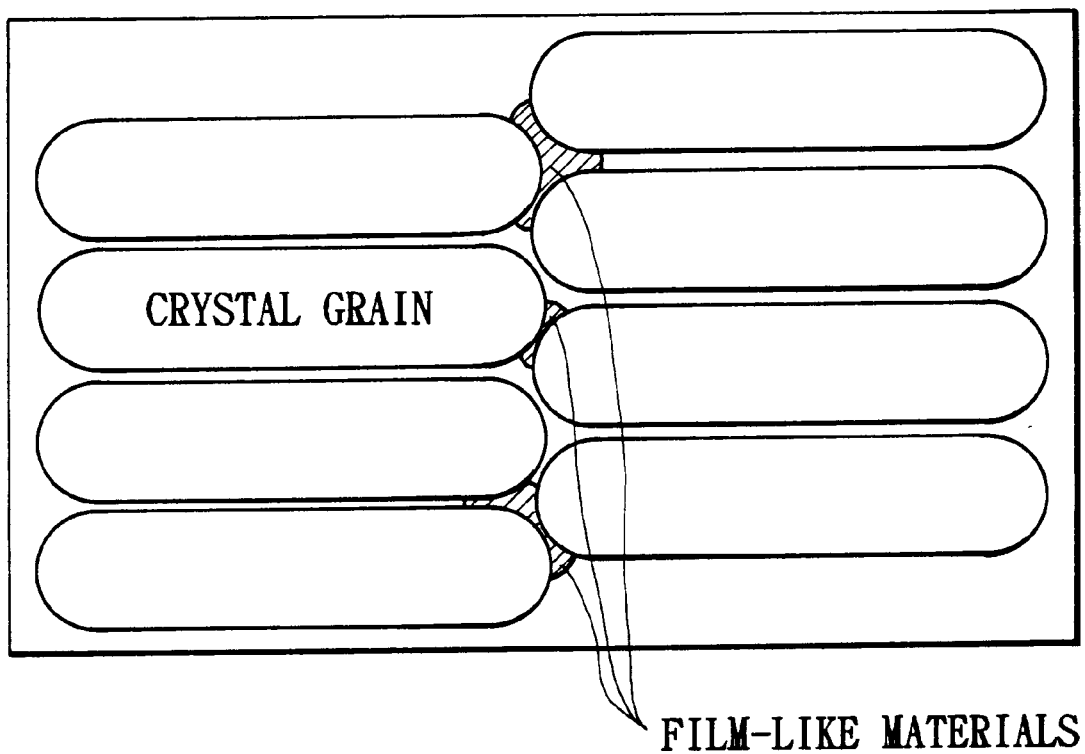
FIG. 10 is a diagram schematically illustrating how a film-like non-superconducting phases lie among superconducting crystal (or crystalline) grains.

Further, the presence of film-like materials in the crystal grain boundary in the sample is confirmed from these figures. Results of the analysis revealed that these film-like materials were film-like non-superconducting phases made of a material, the principal ingredients of which are elements Bi, Pb, Sr, Ca, Cu and O. Further, according to further observation by TEM, it was found that the non-superconducting phases made of the aforementioned film-like materials lay among superconductive crystal grains as if the non-superconducting phase had disconnected the electric coupling (or link) between adjacent superconductive crystal grains. FIG. 10 is a diagram schematically illustrating a manner in which the superconductive crystal grains were intervened by the film-like non-superconducting phase. It is conjectured that the presence of this film-like non-superconducting phase would result in serious limitation to a critical current. Incidentally, the critical current density was about 1,700 A/cm².

Figure 11:
FIG. 11 is a diagram showing a TEM photograph of a rod-like superconductor sample produced by performing the method of the present invention.
Figure 13:
FIG. 13 is a diagram showing still another TEM photograph of a rod-like superconductor sample produced by performing the method of the present invention.
Figure 14:
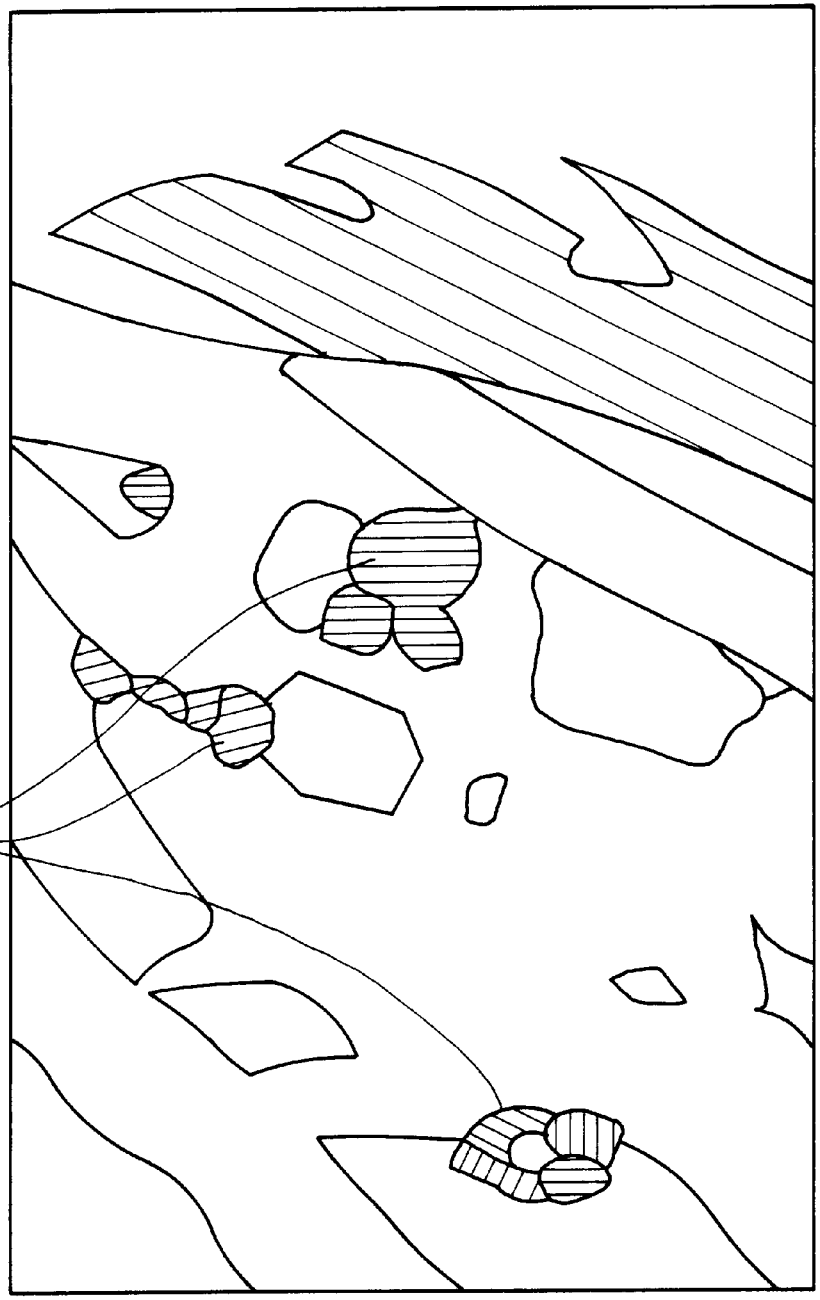
FIG. 14 is a schematic diagram of the photograph of FIG. 11.
Figure 15:
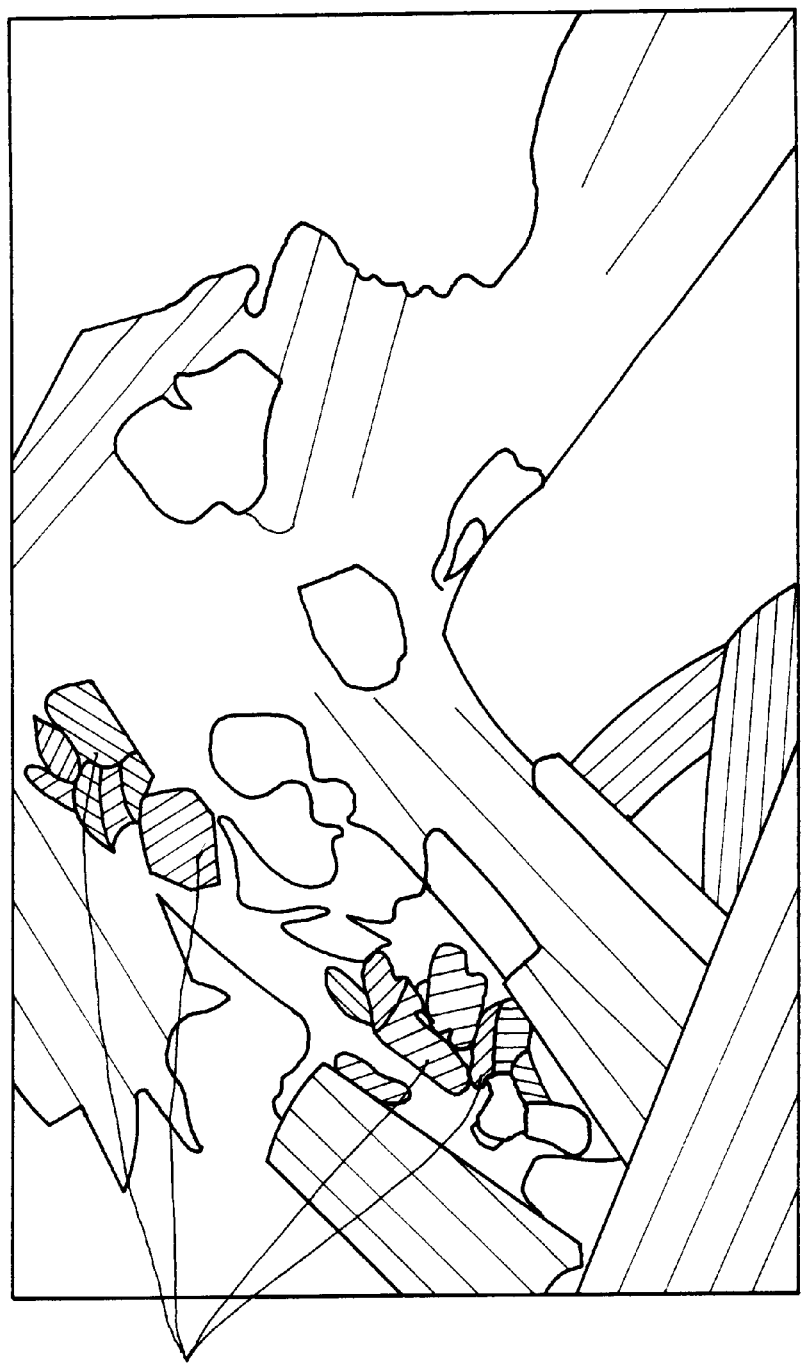
FIG. 15 is a schematic diagram of the photograph of FIG. 12.

FIGS. 11 to 13 show TEM photographs of a sample in the case that the sample was manufactured by a method of the present invention, namely, by setting the aforementioned sintering temperature at a temperature (in the case of this example, 820° C. (incidentally, the heat treatment time period was set at 2 hours)) within the range of 810 to 830° C. FIGS. 14 and 15 are diagrams schematically illustrating the photographs of FIGS. 11 and 12, respectively.

Figure 16:
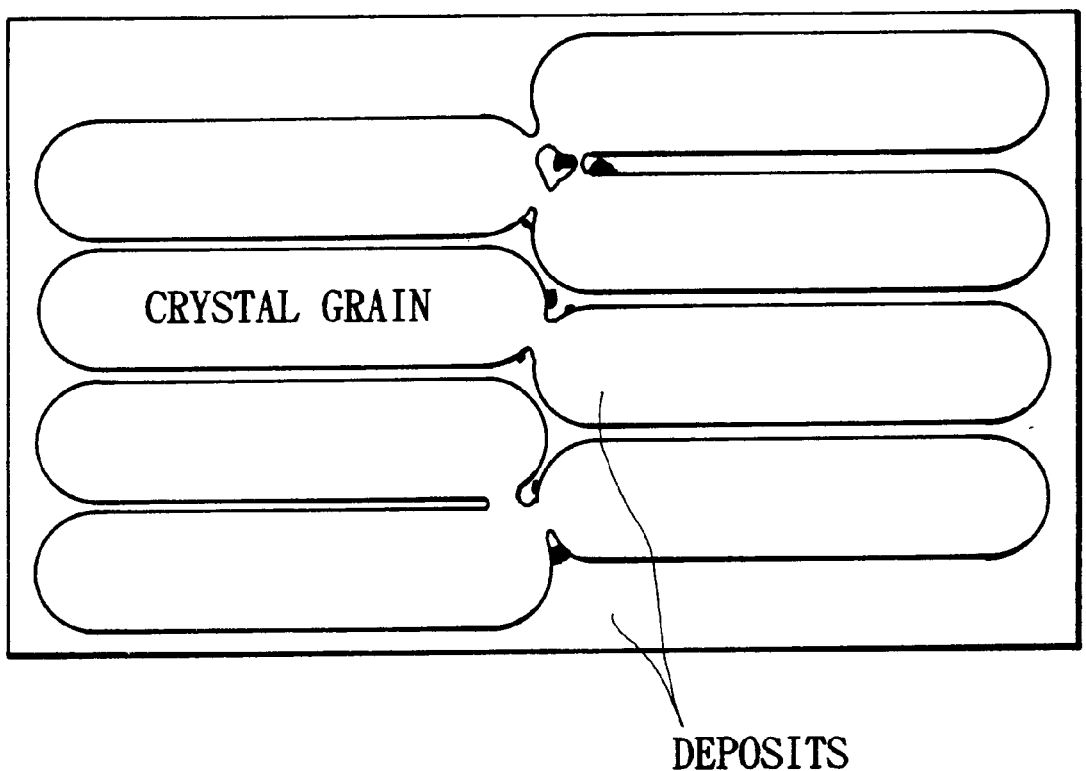
FIG. 16 is a diagram schematically illustrating how superconducting crystal grains are connected with one another.

It was found from these figures that the film-like materials, which would be present in the crystal grain boundaries in the case of the conventional current lead, were vanished in the crystal grain boundaries, that instead of the film-like materials, fine deposits were generated in the grain boundaries, and that crystal grains had grown on the whole and the crystal grains were connected with each other strongly. FIG. 16 is a diagram schematically illustrating a manner in which the superconductive crystal grains were firmly connected with each other. The critical current density of this sample was nearly 50,00 A/cm². It is conjectured that the electric coupling between the crystal grains would be substantially enhanced as a result of the vanishment of the film-like non-superconducting materials and the establishment of the strong electric coupling between the crystal grains.

Incidentally, results of the analysis showed that the (mean) diameter of the aforementioned deposits in the grain boundary was approximately 1.0 μm or less and that the principal ingredients of the deposits were CuO, Cu₂O and Ca₂PbO₄. Further, analysis performed on the sample produced by utilizing observation based on TEM and other analyzing instruments according to various sintering conditions revealed that when the aforementioned deposits in the grain boundaries, which contained CuO, Cu₂O and Ca₂PbO₄ and had a mean diameter of 1.0 μm or less, were observed, the aforesaid film-like non-superconducting phases were hardly observed and that in contrast, when the film-like non-superconducting phase was observed, the aforementioned deposits in the grain boundaries, which contained CuO, Cu₂O and Ca₂PbO₄, were scarcely observed. In addition, it was found that the deposit was at least one of the materials each containing CuO, Cu₂O and Ca₂PbO₄ as main ingredients thereof. In this case, CuO and Cu₂O were observed as being paired with each other almost at all times. However, there was observed the case that Ca₂PbO₄ did not coexist with these compounds.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A method of manufacturing an oxide superconductor current lead, comprising:

a step of working a $Bi_2Sr_2Ca_2Cu_3O_x$ system oxide superconductor, which is obtained by a process of manufacturing an oxide superconductor, into a rod-like or pipe-like oxide superconductor;

a step of forming metallic electrode portions at both end parts of said oxide superconductor, respectively; and a step of performing a heat treatment on said metallic electrode portions thereof at a temperature in a range of 810 to 830° C. to thereby obtain a current lead.

2. The method of manufacturing an oxide superconductor current lead according to claim 1, wherein said step of forming metallic electrode portions at both end parts of said rod-like or pipe-like oxide superconductor, respectively, is performed by one of a process of winding metallic foil around the end parts of said oxide superconductor, a process of applying metallic paste thereto, and a physical vapor phase epitaxy process that includes a sputtering process or an evaporation process.

3. The method of manufacturing an oxide superconductor current lead, according to claim 1, wherein a time period, during which the heat treatment is performed on said metallic electrode portions, is 2 to 20 hours.

4. The method of manufacturing an oxide superconductor current lead, according to claim 1, wherein said metallic electrode portions employ one or more elements of platinum, gold, silver, copper, indium, iridium and aluminum as materials of said metallic electrode portions.

5. The method of manufacturing an oxide superconductor current lead according to claim 1, wherein a non-superconducting phase composed of a material, the principal ingredients of which are Bi, Pb, Sr, Ca, Cu and O, is substantially vanished in a grain boundary in said oxide superconductor, which constitutes said current lead, by performing said heat treatment thereon.

6. The method of manufacturing an oxide superconductor current lead according to claim 1, wherein said $Bi_2Sr_2Ca_2Cu_3O_x$ oxide superconductor is a Bi—Pb—Sr—Ca—Cu—$O_x$ superconductor.

7. A method of manufacturing an oxide superconductor current lead, comprising:

a step of working a $Bi_2Sr_2Ca_2Cu_3O_x$ oxide superconductor into a rod-like or pipe-like oxide superconductor just before a final sintering step of an oxide superconductor manufacturing process;

a step of forming metallic electrode portions at both end parts of said oxide superconductor, respectively; and a step of performing a heat treatment, which is performed during the final sintering step, on said metallic electrode portions thereof at a temperature in a range of 810 to 830° C. to thereby obtain a current lead.

* * * * *